United States Patent
Liu

(10) Patent No.: US 10,868,055 B2
(45) Date of Patent: *Dec. 15, 2020

(54) IMAGE SENSOR AND METHOD FOR FORMING THE SAME

(71) Applicant: Taiwan Semiconductor Manufacturing Co., Ltd., Hsin-Chu (TW)

(72) Inventor: Ming-Chyi Liu, Hsinchu (TW)

(73) Assignee: TAIWAN SEMICONDUCTOR MANUFACTURING CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 16/396,572

(22) Filed: Apr. 26, 2019

(65) Prior Publication Data

US 2019/0252434 A1    Aug. 15, 2019

Related U.S. Application Data

(60) Continuation of application No. 15/942,512, filed on Mar. 31, 2018, now Pat. No. 10,276,613, which is a division of application No. 14/466,308, filed on Aug. 22, 2014, now Pat. No. 9,935,139.

(51) Int. Cl.
*H01L 27/00* (2006.01)
*H01L 27/146* (2006.01)

(52) U.S. Cl.
CPC .... *H01L 27/14612* (2013.01); *H01L 27/1463* (2013.01); *H01L 27/14614* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 7,038,259 B2 | 5/2006 | Rhodes et al. | |
| 7,417,273 B2 | 8/2008 | Inoue et al. | |
| 7,749,788 B2 | 7/2010 | Okagawa et al. | |
| 8,354,631 B2 | 1/2013 | Tateshita et al. | |
| 8,440,540 B2 | 5/2013 | Liu et al. | |
| 8,951,869 B2 | 2/2015 | Tsukamoto et al. | |
| 9,006,080 B2 | 4/2015 | Chou et al. | |
| 10,276,613 B2 * | 4/2019 | Liu | H01L 27/14612 |
| 2007/0187787 A1 | 8/2007 | Ackerson et al. | |
| 2010/0197128 A1 * | 8/2010 | Schaeffer | H01L 21/823807 438/591 |

(Continued)

FOREIGN PATENT DOCUMENTS

| | | |
|---|---|---|
| JP | 2006100620 | 4/2006 |
| JP | 2009088447 | 4/2009 |

(Continued)

*Primary Examiner* — Reema Patel
(74) *Attorney, Agent, or Firm* — Haynes and Boone, LLP

(57) ABSTRACT

An image sensor and a method for forming an image sensor are provided. The image sensor includes a substrate, and the substrate includes a pixel region, a peripheral region and a boundary region, and the boundary region is formed between the pixel region and the peripheral region. The image sensor also includes a first gate stack structure formed in the pixel region and a second gate stack structure formed in the peripheral region. The second gate stack structure includes a high-k dielectric layer and a first metal layer.

20 Claims, 13 Drawing Sheets

(56) References Cited

U.S. PATENT DOCUMENTS

2014/0227843 A1 8/2014 Tsukamoto et al.
2014/0264719 A1 9/2014 Chou et al.

FOREIGN PATENT DOCUMENTS

| JP | 2010232284 | 10/2010 |
| KR | 20090071227 | 7/2009 |
| TW | 201015691 | 4/2010 |
| WO | WO2012029644 | 3/2012 |

* cited by examiner

IMAGE SENSOR AND METHOD FOR FORMING THE SAME

PRIORITY DATA

The present application is a continuation application of U.S. patent application Ser. No. 15/942,512, filed Mar. 31, 2018, which is a divisional application of U.S. patent application Ser. No. 14/466,308, filed Aug. 22, 2014, now U.S. Pat. No. 9,935,139, entitled "IMAGE SENSOR AND METHOD FOR FORMING THE SAME," hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

An image sensor is a semiconductor device for converting an optical image into an electrical signal. The image sensor is roughly classified as a charge coupled device (CCD) or a CMOS image sensor (CIS). One type of the CIS is Front Side Illumination (FSI) image sensor. In the FSI image sensors, light travels to a photo-sensing area through the front side of the pixel. This means that the incident light has to first pass through dielectric layers, and metal layers before it strikes the photo-sensing area, causing low quantum efficiency (QE), serious cross talk between pixels, and dark current. Another type of CIS is Back Side illumination (BSI) image sensors. Instead of illuminating a CMOS image sensor from the top (front) side of the silicon die, a BSI image sensor applies the color filters and the microlens to the back side of the pixels so that the incident light is collected from the back side of the image sensor. Compared to the FSI image sensors, the BSI image sensors have less light loss, reduced crosstalk, and better quantum efficiency.

Although existing image sensors have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
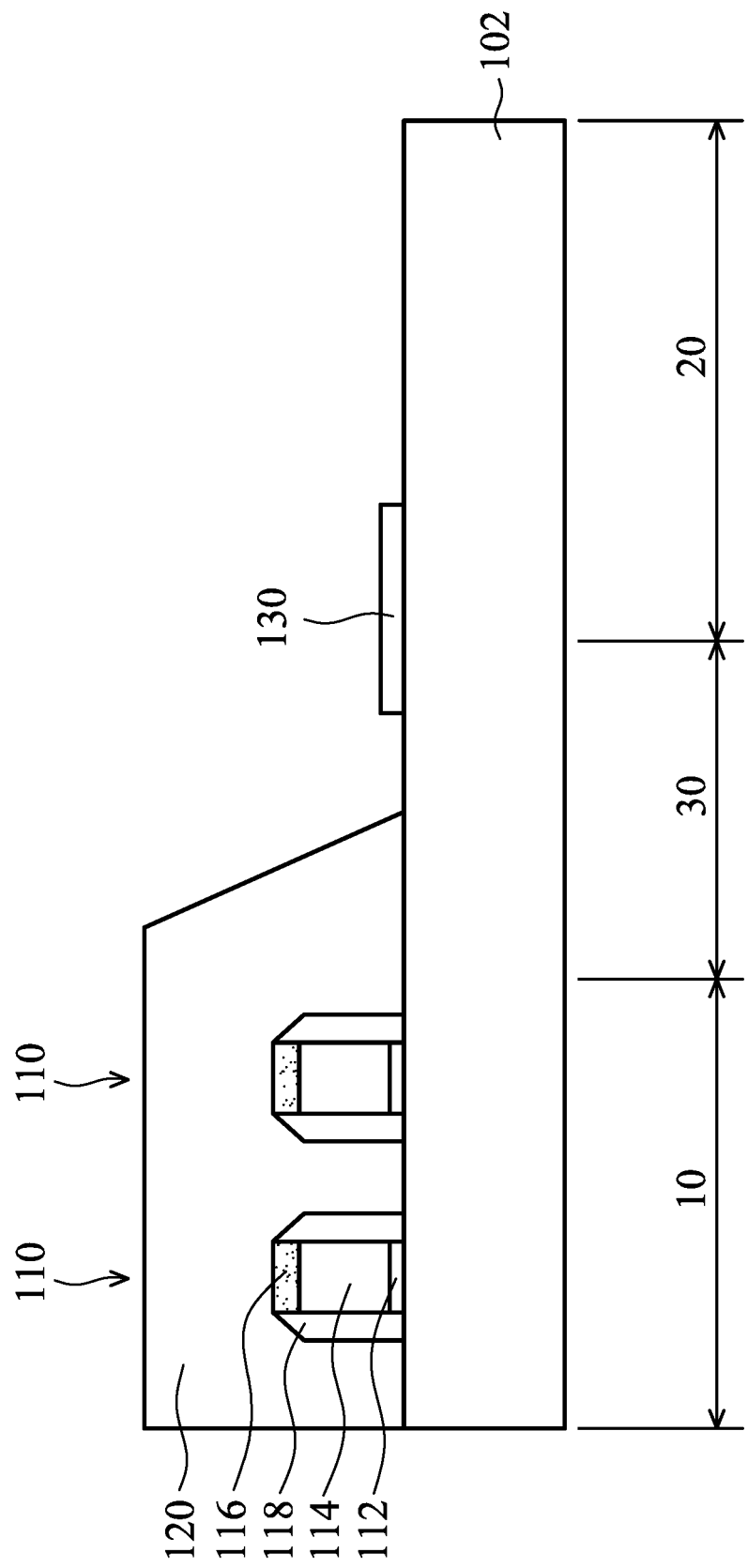
FIG. 1A-1M show cross-sectional representations of various stages of forming an image sensor, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments of an image sensor and a method for forming an image sensor are provided. FIG. 1A-1M show cross-sectional representations of various stages of forming an image sensor, in accordance with some embodiments of the disclosure. The image sensor is a complementary metal oxide semiconductor. In some embodiments, the image sensor is a front-side illumination (FSI) image sensor or a back-side illumination (BSI) image sensor.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 includes a pixel region 10, a peripheral region 20 and a boundary region 30. The boundary region 30 is formed between the pixel region 10 and the peripheral region 20. The pixel region 10 is surrounded by the peripheral region 20 when seen from a top-view.

In the pixel region 10, one or more gate stack structure 110 is formed in the pixel region 10. The gate stack structure 110 includes a gate dielectric layer 112, a gate electrode layer 114, a hard mask layer 116 and gate spacers 118. The gate electrode layer 114 is formed on the gate dielectric layer 112, and the hard mask layer 116 is formed on the gate electrode layer 114. The gate spacers 118 are formed on the opposite sidewalls of the gate electrode layer 114. In some other embodiments, the gate stack structure 110 includes additional layers, such as interfacial layers, capping layers, diffusion/barrier layers, or other applicable layers.

The gate dielectric layer 112 may include dielectric materials, such as silicon oxide, silicon nitride, silicon oxynitride, or combinations thereof. The gate electrode layer 114 may include polysilicon.

Although two gate stack structures 110 are formed in the pixel region 10, the number of the gate stack structures 110 are not limited to two and it may be adjusted according to actual application. The gate stack structure 110 may be a transfer transistor, a reset transistor, a source-follower transistor or a select transistor.

At least one photodiode (PD) (not shown) is positioned in the pixel region 10. The photodiode usually receives the incoming light and converts the light into current signals. Furthermore, various doped regions are in the substrate 102 in the pixel region 10. The doped regions correspond to the gate stack structure 110 as source/drain regions.

It should be noted that the devices (such as a photodiode or the gate stack structure 110) in the pixel region 10 are formed first, and the devices in the peripheral region 20 are formed afterwards.

A protection layer 120 is formed on the gate stack structure 110 to cover the gate stack structure 110. The protection layer 120 is used to prevent the underlying devices from being etched during the subsequent processes. In some embodiments, the protection layer 120 is amorphous silicon.

In the peripheral region 20 and the boundary region 30, an oxide layer 130 is formed on the substrate 102. In some embodiments, when the high-voltage devices are formed in the peripheral region 20, a thick gate dielectric layer is needed. Therefore, the oxide layer 130 is used as a gate dielectric layer to provide a thick thickness.

Figure 1B:
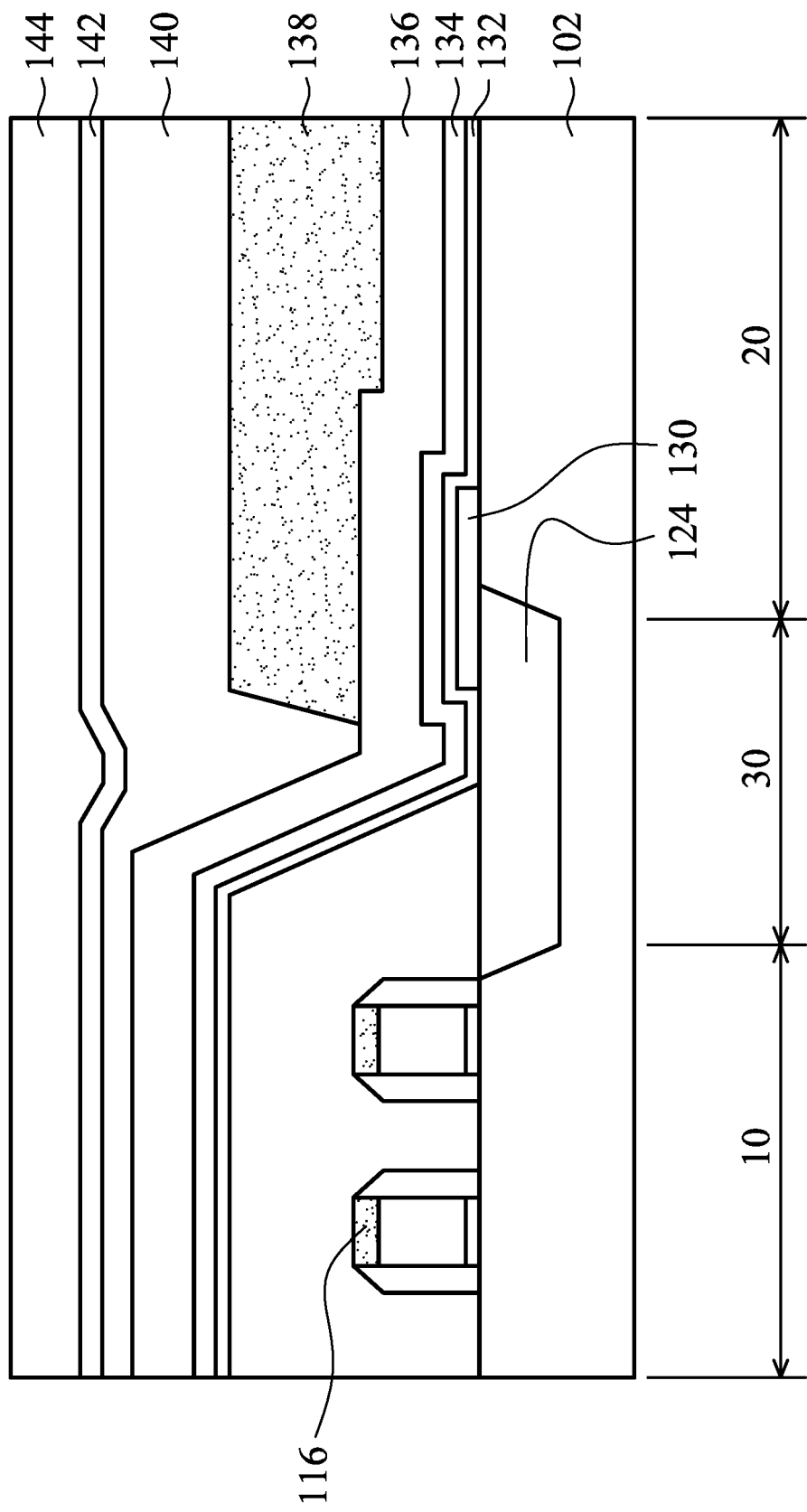

Referring to FIG. 1B, an isolation structure 124, such as a shallow trench isolation (STI) structure, is formed in the substrate 102. The isolation structure 124 prevents electrical interference or crosstalk. Afterwards, a high-k dielectric layer 132 is conformally formed on the protection layer 120, the substrate 102, the isolation structure 124 and the oxide layer 130. A first metal layer 134 is formed on the high-k dielectric layer 132. A polysilicon layer 136 is formed on first metal layer 134.

The high-k dielectric layer 132 includes hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, similar materials, or combinations thereof. The first metal layer 134 includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. The gate spacers 118 are made of a dielectric layer, such as a silicon nitride layer, a silicon oxynitride layer, or combinations thereof.

In some other embodiments, an interfacial layer (IL) is formed between the high-k dielectric layer 132 and the substrate 102 to improve the adhesion therebetween.

Afterwards, a hard mask layer 138 is formed on the polysilicon layer 136 in the peripheral region 20 and the boundary region 30. The hard mask layer 138 is used to pattern the underlying layers (such as the polysilicon layer 136, the first metal layer 134 and the high-k dielectric layer 132). The hard mask layer 138 may be made of tetraethyl ortho silicate (TEOS), silicon oxide, silicon nitride, silicon oxynitride, or other applicable materials.

A bottom layer 140 is formed on the hard mask layer 138 and the polysilicon layer 136. A middle layer 142 is formed on the bottom layer 140. A bottom anti-reflective coating (BARC) 144 is formed on the middle layer 142. The middle layer 142 is made of a dielectric layer. The bottom anti-reflective coating (BARC) 144 is made of silicon nitride (SiN), silicon carbide (SiC), silicon oxynitride (SiON). In some embodiments, the bottom layer 140 is made of amorphous carbon, the middle layer 142 is made of silicon oxynitride and the bottom anti-reflective coating (BARC) 144 is made of silicon oxynitride (SiON).

The bottom layer 140, the middle layer 142 or the BARC 144 is independently formed by deposition processes, such as a chemical vapor deposition (CVD) process, high-density plasma chemical vapor deposition (HDPCVD) process, spin-on process, sputtering process, or other applicable processes.

It should be noted that in the pixel region 10, the high-k dielectric layer 132 is formed on the protection layer 120, and in the peripheral region 20, the high-k dielectric layer 132 is formed on the substrate 102 and the oxide layer 130, and therefore a top surface of the high-k dielectric layer 132 in the pixel region 10 is higher than a top surface of the high-k dielectric layer 132 in the peripheral region 20. In addition, in the boundary region 30, the high-k dielectric layer 132 is formed on the sloped sidewall of the protection layer 120.

Figure 1C:
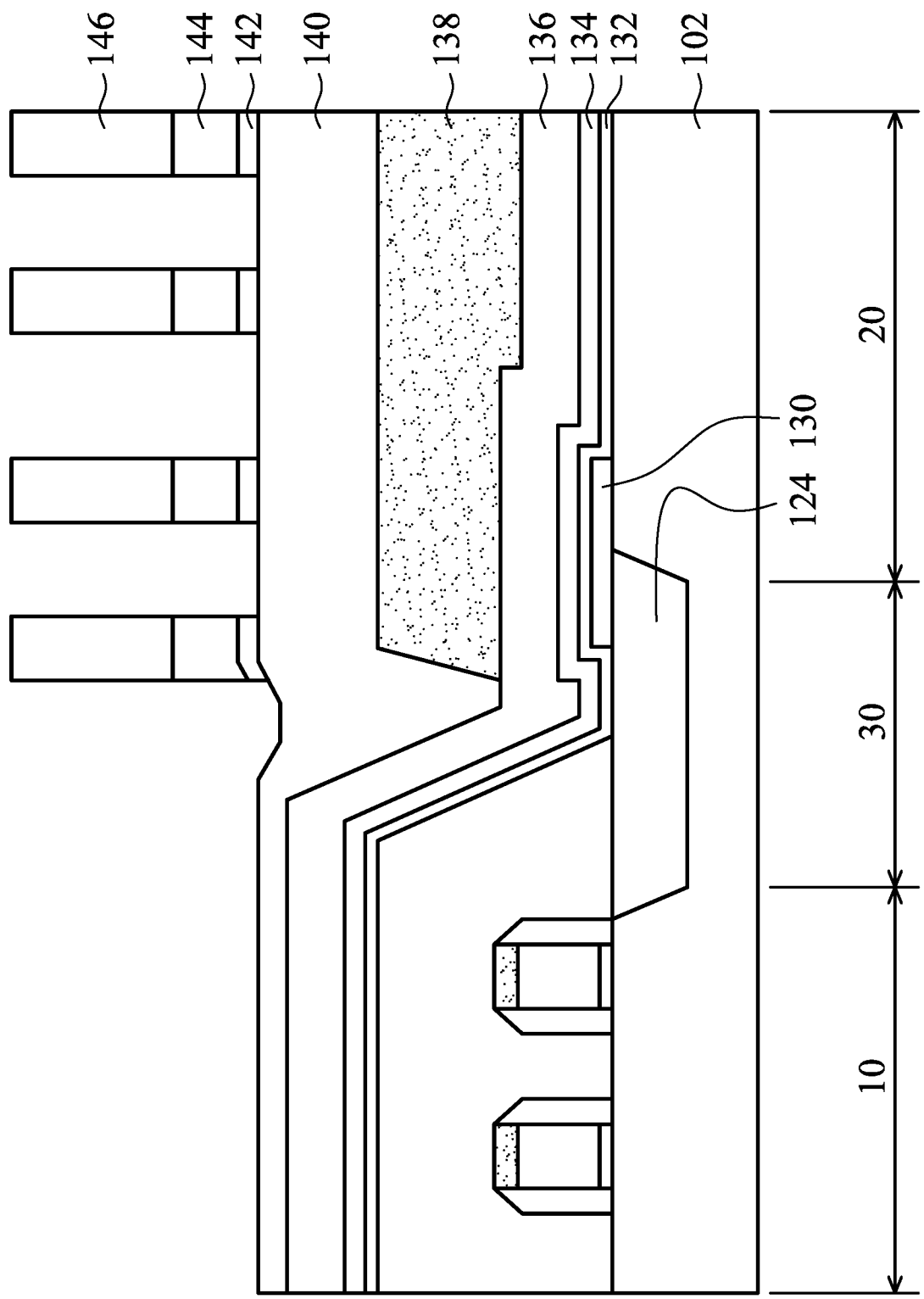

After the bottom anti-reflective coating (BARC) 144 is formed, a photoresist layer 146 is formed on the BARC 144 as shown in FIG. 1C, in accordance with some embodiments of the disclosure. Afterwards, the photoresist layer 146 is patterned by a patterning process to form a patterned photoresist layer 146. The middle layer 142 and the BARC 144 are patterned by using the patterned photoresist layer 146 as a mask. Afterwards, the patterned photoresist layer 146 is removed.

The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1D:
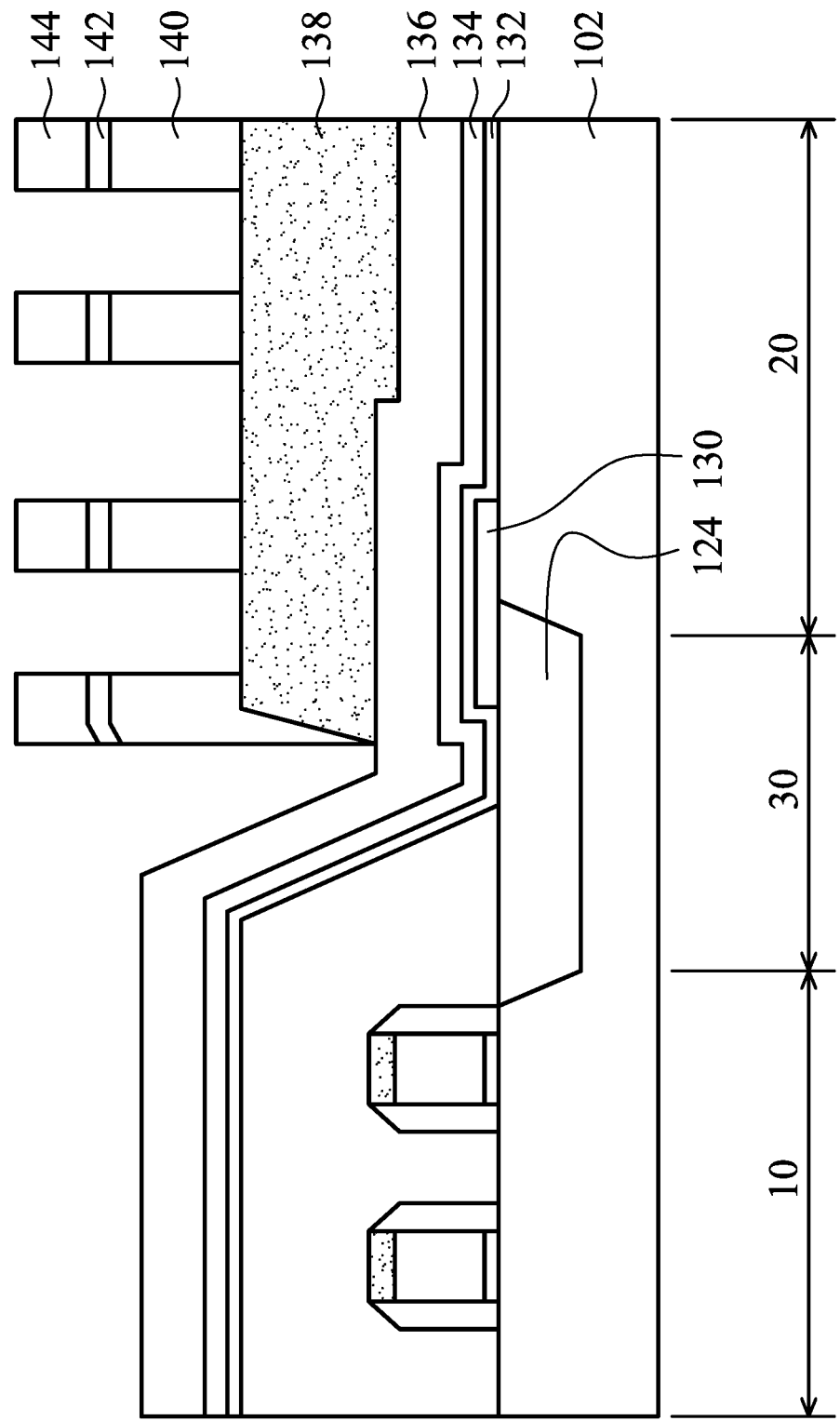

After the middle layer 142 and the BARC 144 are patterned, the bottom layer 140 is patterned by using the patterned middle layer 142 and the patterned BARC 144 as a mask as shown in FIG. 1D, in accordance with some embodiments of the disclosure.

Figure 1E:
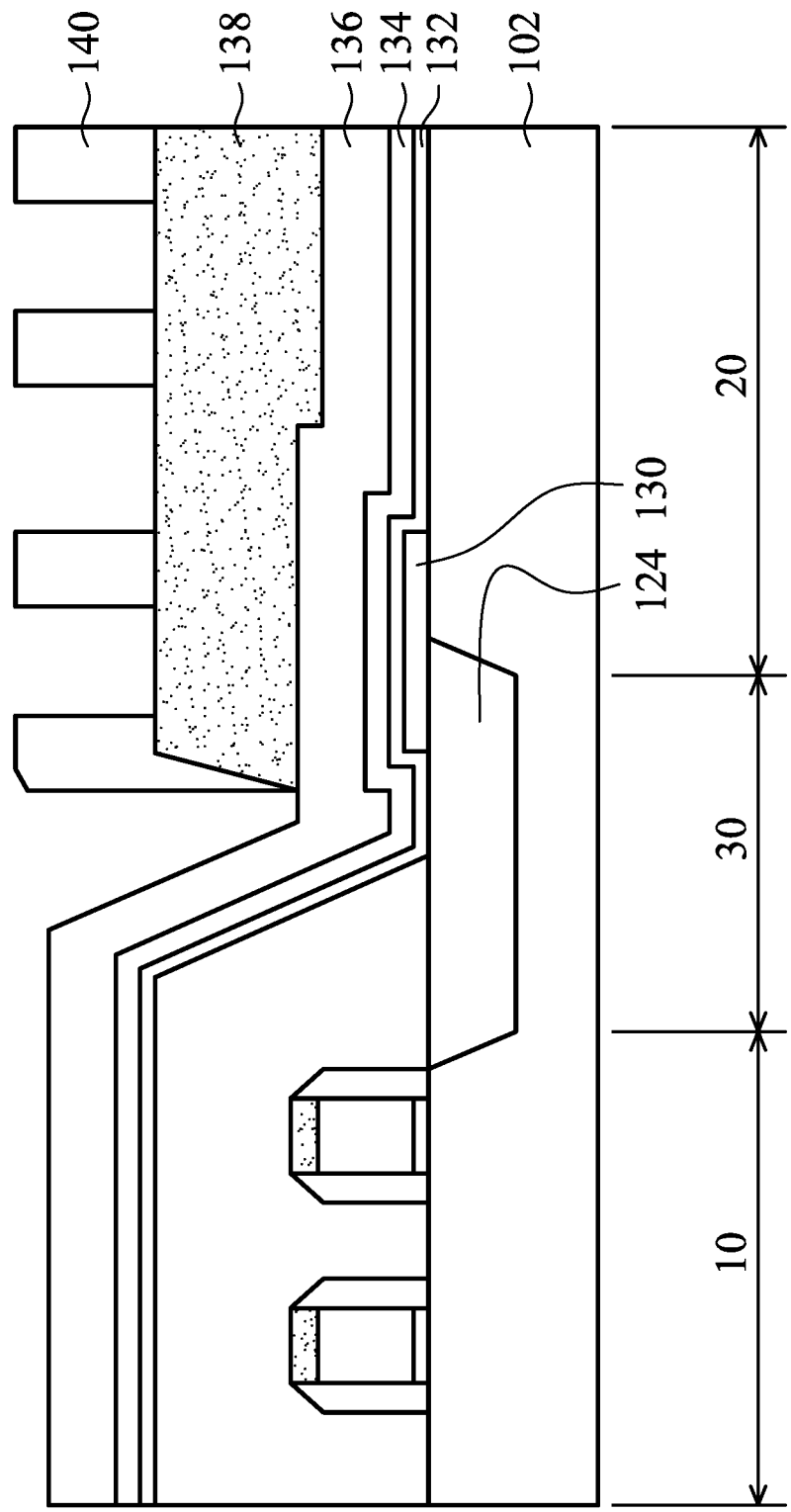

Afterwards, the middle layer 142 and the BARC 144 are removed, and a patterned bottom layer 140 is obtained as shown in FIG. 1E, in accordance with some embodiments of the disclosure. In some embodiments, the middle layer 142 and the BARC 144 are removed by an etching process, such as a dry etching process or a wet etching process.

Figure 1F:
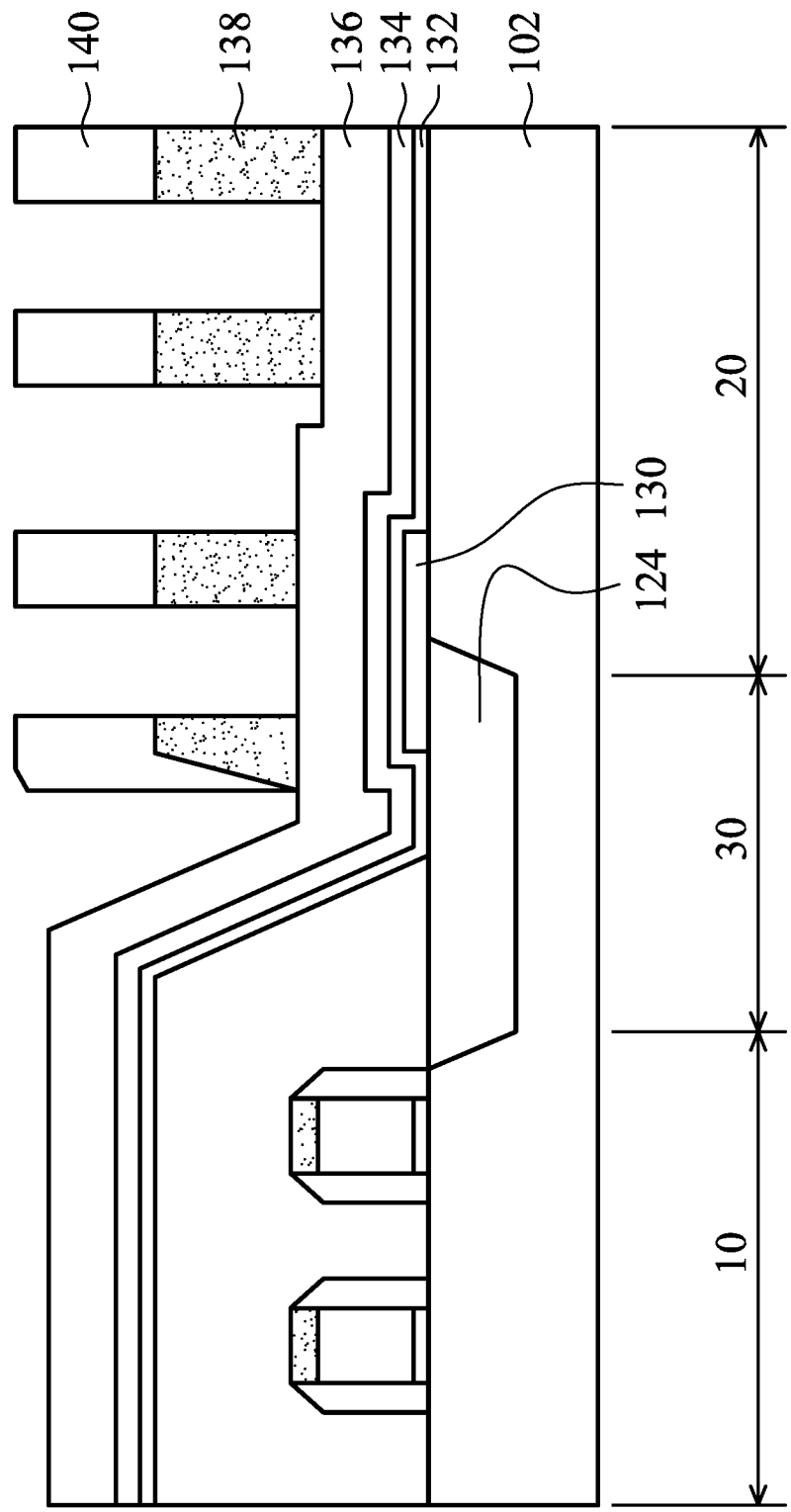

After the patterned bottom layer 140 is obtained, the hard mask layer 138 is patterned by using the patterned bottom layer 140 as a mask to form a patterned hard mask layer 138 as shown in FIG. 1F, in accordance with some embodiments of the disclosure. Afterwards, the patterned bottom layer 140 is removed by a dry etching process or a wet etching process.

Figure 1G:
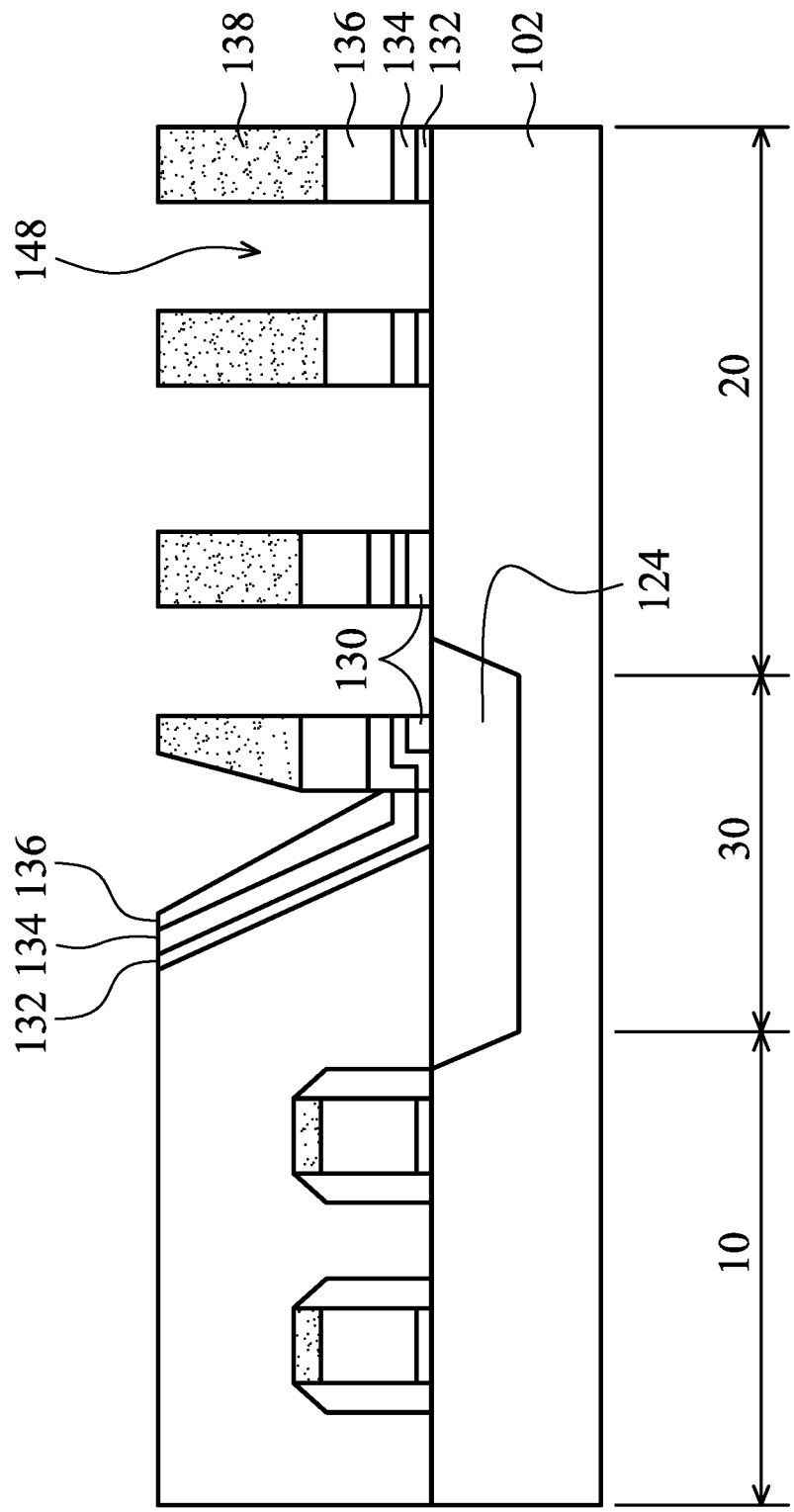

After the patterned bottom layer 140 is removed, the oxide layer 130, the high-k dielectric layer 132, the first metal layer 134 and the polysilicon layer 136 are patterned by using patterned hard mask layer 138 as a mask as shown in FIG. 1G, in accordance with some embodiments of the disclosure. The patterned high-k dielectric layer 132 in the peripheral region 20 is used as a gate dielectric layer, and the patterned first metal layer 134 is used as a portion of a gate electrode layer.

As shown in FIG. 1G, the high-k dielectric layer 132 and the first metal layer 134 are removed in the pixel region 10, while the high-k dielectric layer 132 and the first metal layer 134 remain on the protection layer 120. It should be noted that the high-k dielectric layer 132 and the first metal layer 134 in the boundary region 30 are formed between the protection layer 120 and the stack structures in the peripheral region 20 (including the pattered polysilicon layer 136 and the patterned hard mask layer 138), and therefore the high-k dielectric layer 132 and the first metal layer 134 are hard to be removed. As a result, high-k dielectric layer 132 and the first metal layer 134 remains in the boundary region 30.

However, the performance of the image sensor may be degraded by the remaining high-k dielectric layer 132 and the first metal layer 134 in the boundary region 30. Therefore, the remaining high-k dielectric layer 132 and the first metal layer 134 in the boundary region 30 are removed in the subsequent process.

Figure 1H:
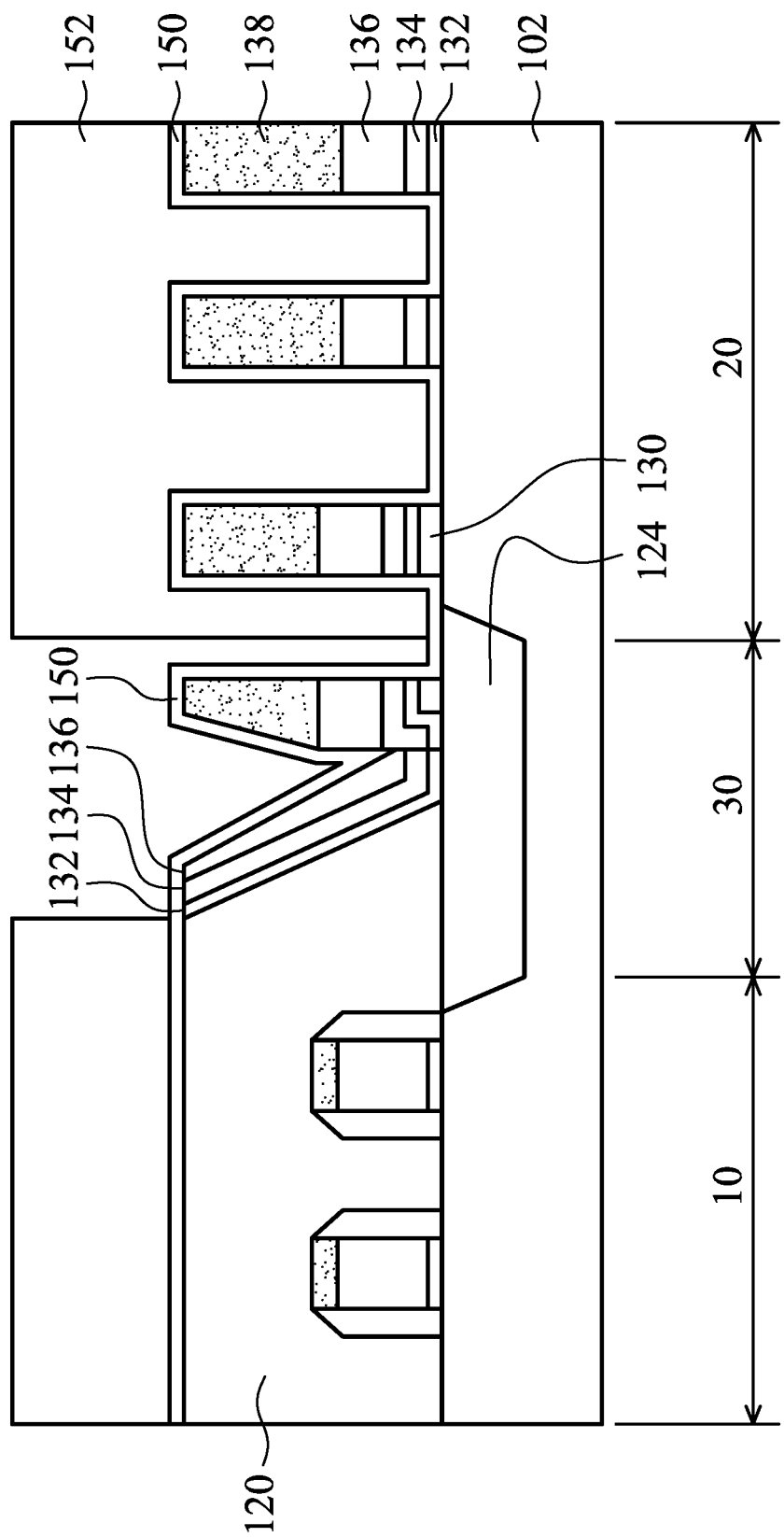

Afterwards, a sealing layer 150 is formed on the hard mask layer 138 in the peripheral region 20, on the polysilicon layer 136 in the boundary region 30, and on the protection layer 120 in the pixel region 10 as shown in FIG. 1H, in accordance with some embodiments of the disclosure. It should be noted that one or more stack structure is formed in the peripheral region 20 of FIG. 1G, and a plurality of cavities 148 are formed between two adjacent stack structures. Therefore, afterwards, as shown in FIG. 1H, the sealing layer 150 is conformally formed along the pattern of the stack structure. The sealing layer 150 is also formed in the sidewalls and the bottom of the cavity 148.

The sealing layer 150 is made of a dielectric material. The dielectric material may include, for example, a silicon nitride, silicon oxide, silicon oxynitride, other suitable materials, and/or combinations thereof. The sealing layer 150 is deposited on the surfaces of the stack structure in the peripheral region 20 by using a suitable process, such as a chemical vapor deposition (CVD) process.

Afterwards, the photoresist layer 152 is formed on the sealing layer 150. It should be noted that the photoresist layer 152 is formed in the pixel region 10 and the peripheral region 20 to protect the devices in the pixel region 10 and the peripheral region 20.

Figure 1I:
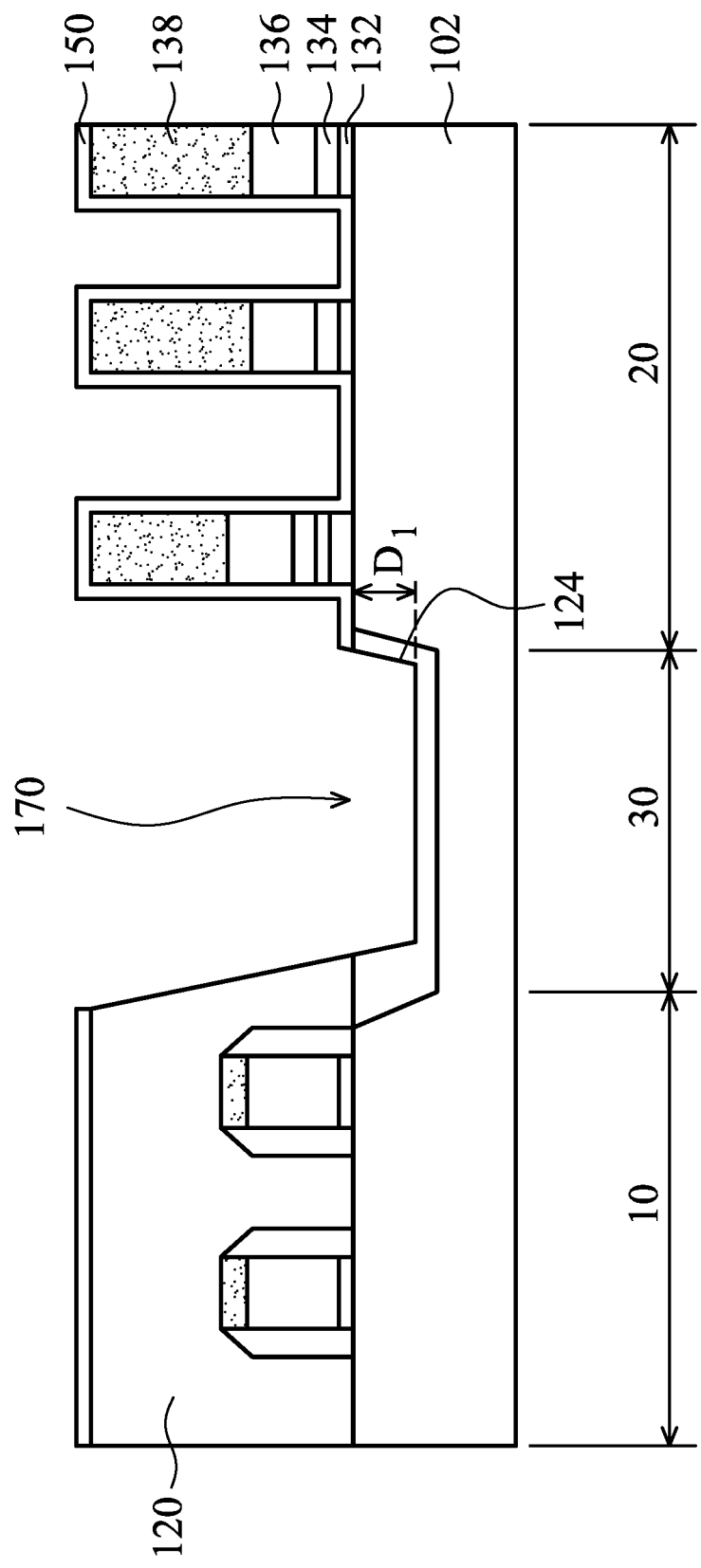

After the photoresist layer 152 is formed, the exposed sealing layer 150 is removed as shown in FIG. 1I, in accordance with some embodiments of the disclosure. Afterwards, the hard mask layer 138 and the polysilicon layer 136, the first metal layer 134 and the high-k dielectric layer 132 are respectively and sequentially removed.

The hard mask layer 138 and the polysilicon layer 136, the first metal layer 134 and the high-k dielectric layer 132 are respectively removed by a dry etching process or a wet etching process. In some embodiments, the dry etching gas includes chlorine ($Cl_2$), boron chloride ($BCl_3$) or fluorine (F)-based gas. In some embodiments, the wet etching solution includes HF-based solution, $NH_4OH$ solution, $NH_4OH/H_2O_2$ solution, $HCl/H_2O_2$ solution, $H_2SO_4/H_2O_2$ solution.

In order to completely remove the first metal layer 134 and the high-k dielectric layer 132, an over-etching process is performed on a portion of the isolation structure 124. Therefore, a recess 170 is formed by removing the portion of the isolation structure 124.

It should be noted that the recess 170 should not be deeper than the isolation structure 124. The recess 170 extends from a top surface of the substrate 102 to a depth Di. In some embodiments, the depth Di is in a range from about 10 A to about 5000 A. If the depth Di is too great, too much of the isolation structure 124 is removed. If the depth Di is too small, the first metal layer 134 and the high-k dielectric layer 132 may be remaining.

Figure 1J:
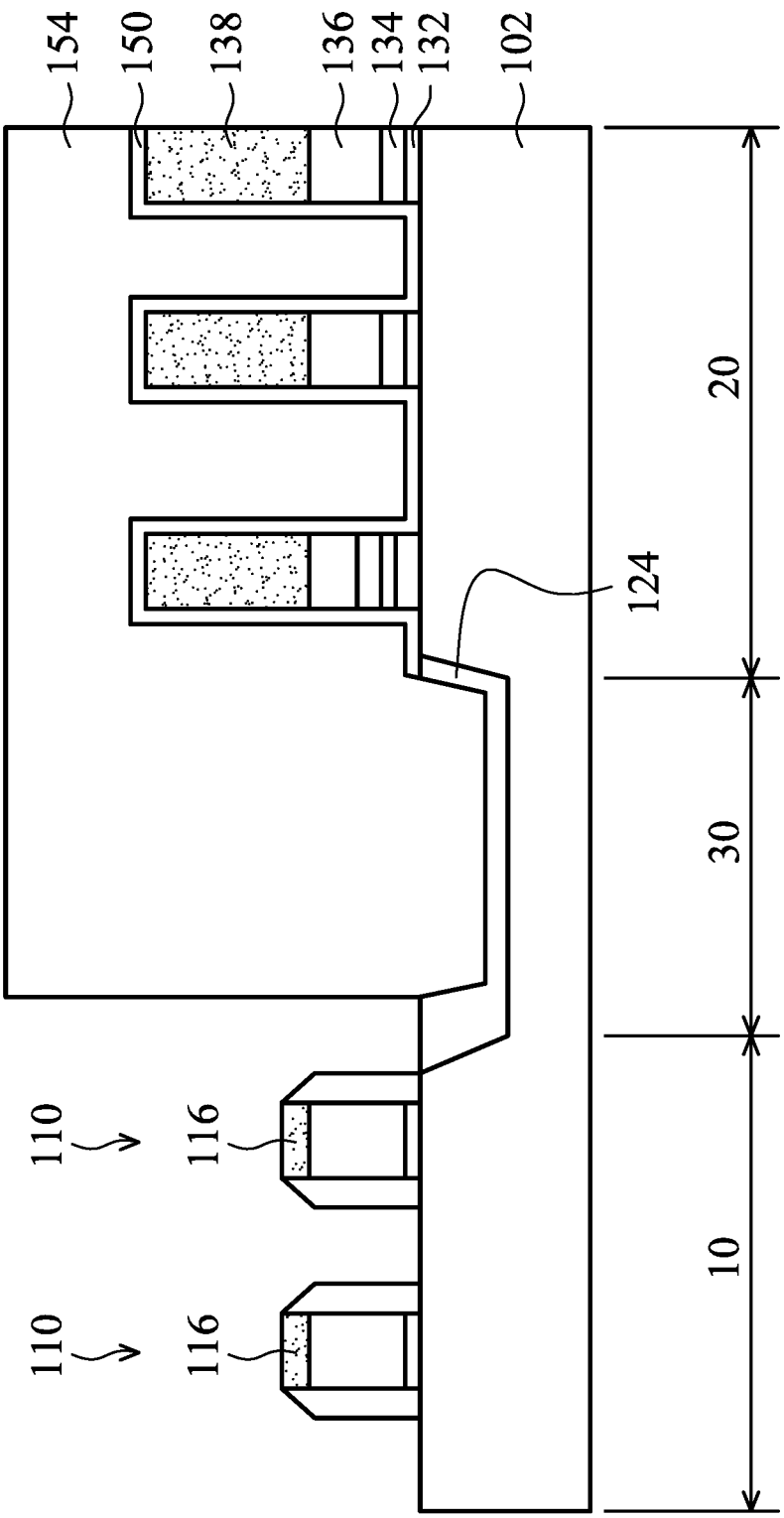

After the over-etching process, a photoresist layer 154 is formed in the peripheral region 20 and the boundary region 30 as shown in FIG. 1J, in accordance with some embodiments of the disclosure. Afterwards, the sealing layer 150 and the protection layer 120 in the pixel region 10 are removed to expose the hard mask layer 116. Afterwards, the photoresist layer 154 is removed.

Figure 1K:
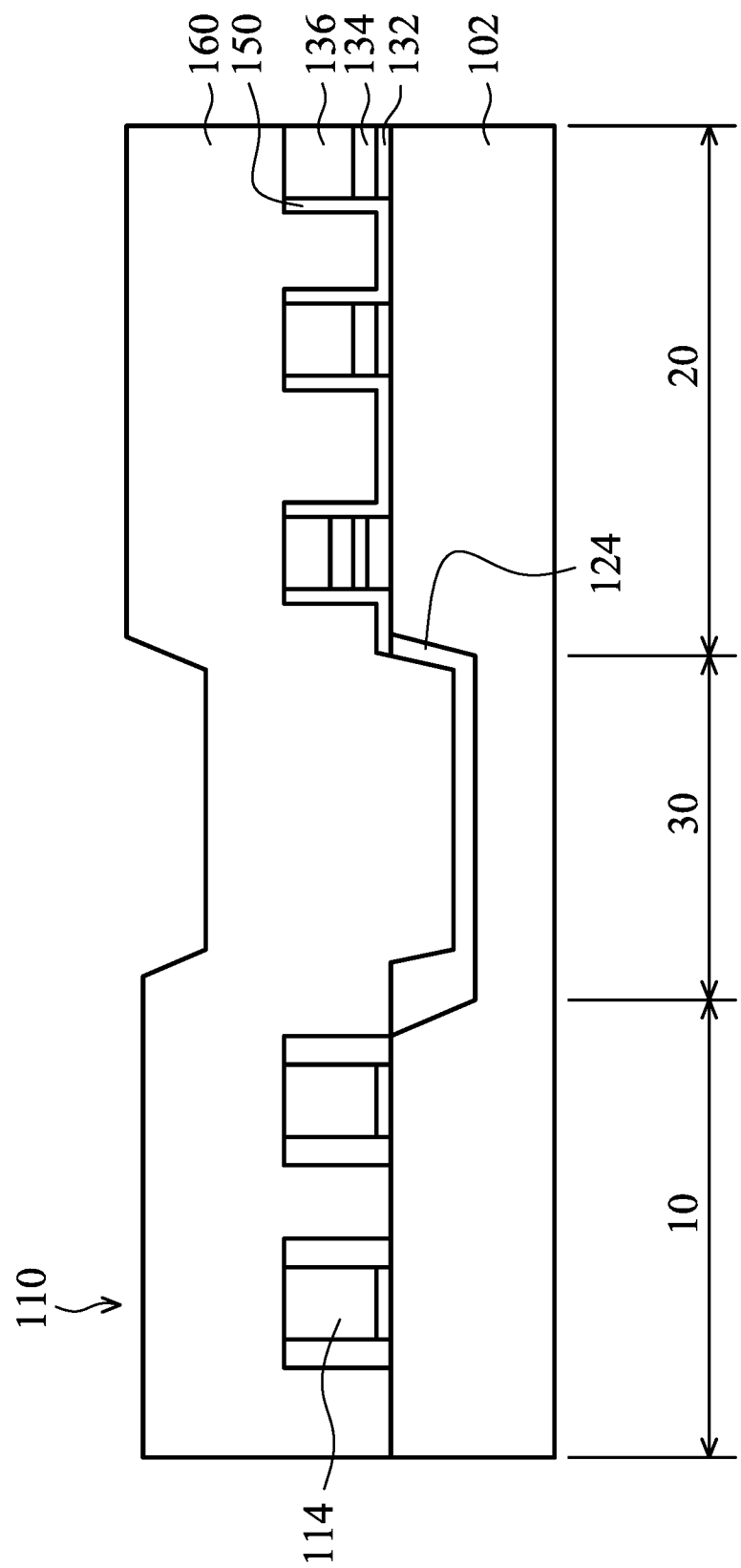

After the photoresist layer 154 is removed, a portion of sealing layer 150 in the peripheral region 20, the hard mask layer 116 in the pixel region 10 and the hard mask layer 138 in the peripheral region 20 are removed as shown in FIG. 1K, in accordance with some embodiments of the disclosure. Therefore, in the pixel region 10, a top surface of the gate electrode layer 114 is exposed. In the boundary region 30, the isolation structure 124 is exposed. In the peripheral region 20, a top surface of the polysilicon layer 136 is exposed.

Afterwards, an interlayer dielectric (ILD) layer 160 is formed on the exposed surface of the gate electrode layer 114, the exposed isolation structure 124 and the exposed surface of the polysilicon layer 136.

The ILD layer 160 is made of silicon oxide, doped or undoped silicon oxide, undoped silicate glass (USG), phosphorus-doped silicon glass (PSG), boron phosphorus silicate glass (BPSG), phenyl triethoxy silicate (PTEOS) or boron phosphorous tetraethyl silicate (BPTEOS). The ILD 160 is formed by a chemical vapor deposition (CVD) process, a high-density plasma CVD process (HDP CVD), a spin coating or a deposition furnace.

Figure 1L:
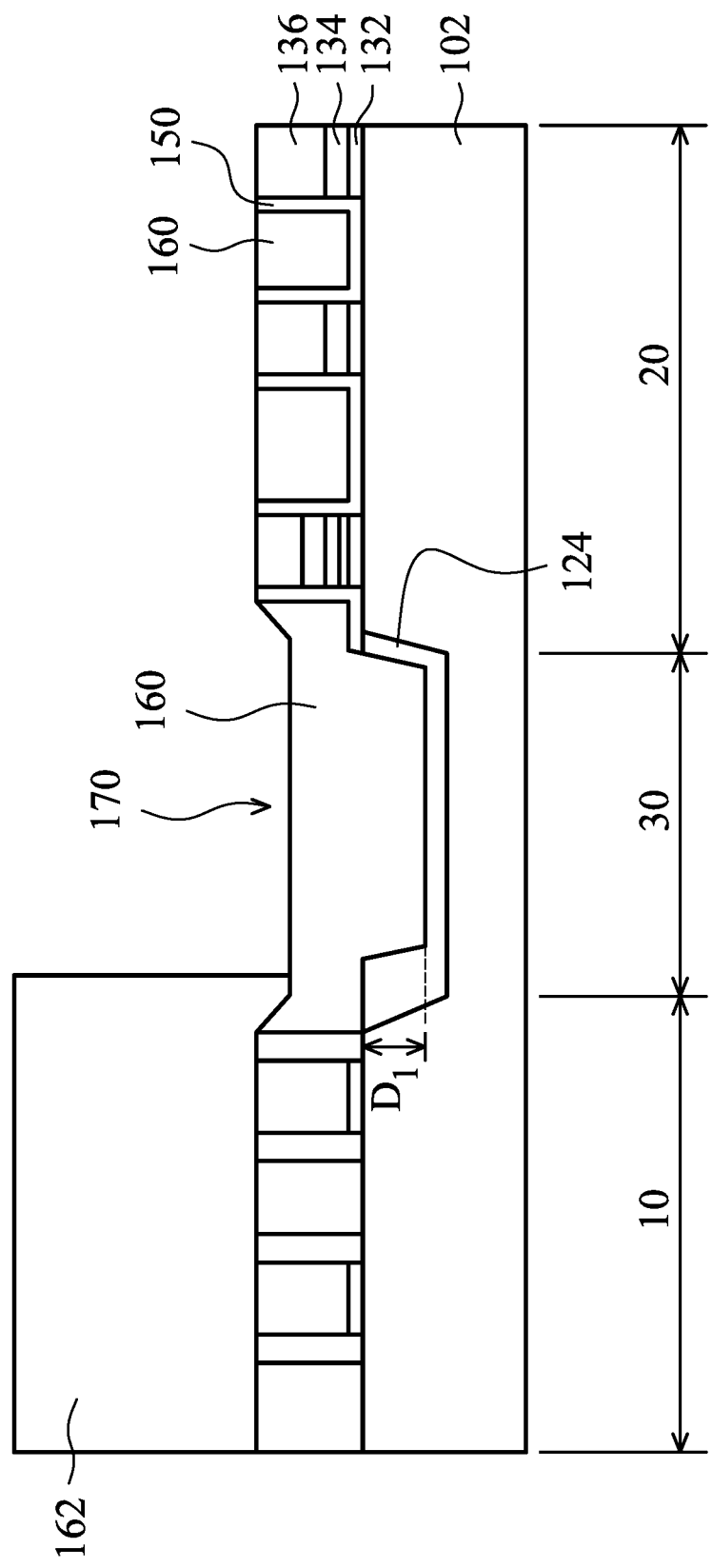

After the ILD layer 160 is deposited, a planarizing process is performed on the ILD layer 160 as shown in FIG. 1L, in accordance with some embodiments of the disclosure. In some embodiments, the planarizing process is a chemical mechanical polishing (CMP) process. After the planarizing process, a photoresist layer 162 is formed on the top surface of the ILD layer 160 in the pixel region 10.

It should be noted that because the recess 170 is formed in the substrate 210, the ILD layer 160 has a recessed surface in the boundary region 30. After the planarizing process, a top surface of the ILD layer 160 in the boundary region 30 is lower than that in the pixel region 10 or in the peripheral region 20. In other words, a portion of the ILD layer 160 in the boundary region 30 extends from a top surface of the substrate 102 to a depth Di in a range from about 10 A to about 5000 A.

Figure 1M:
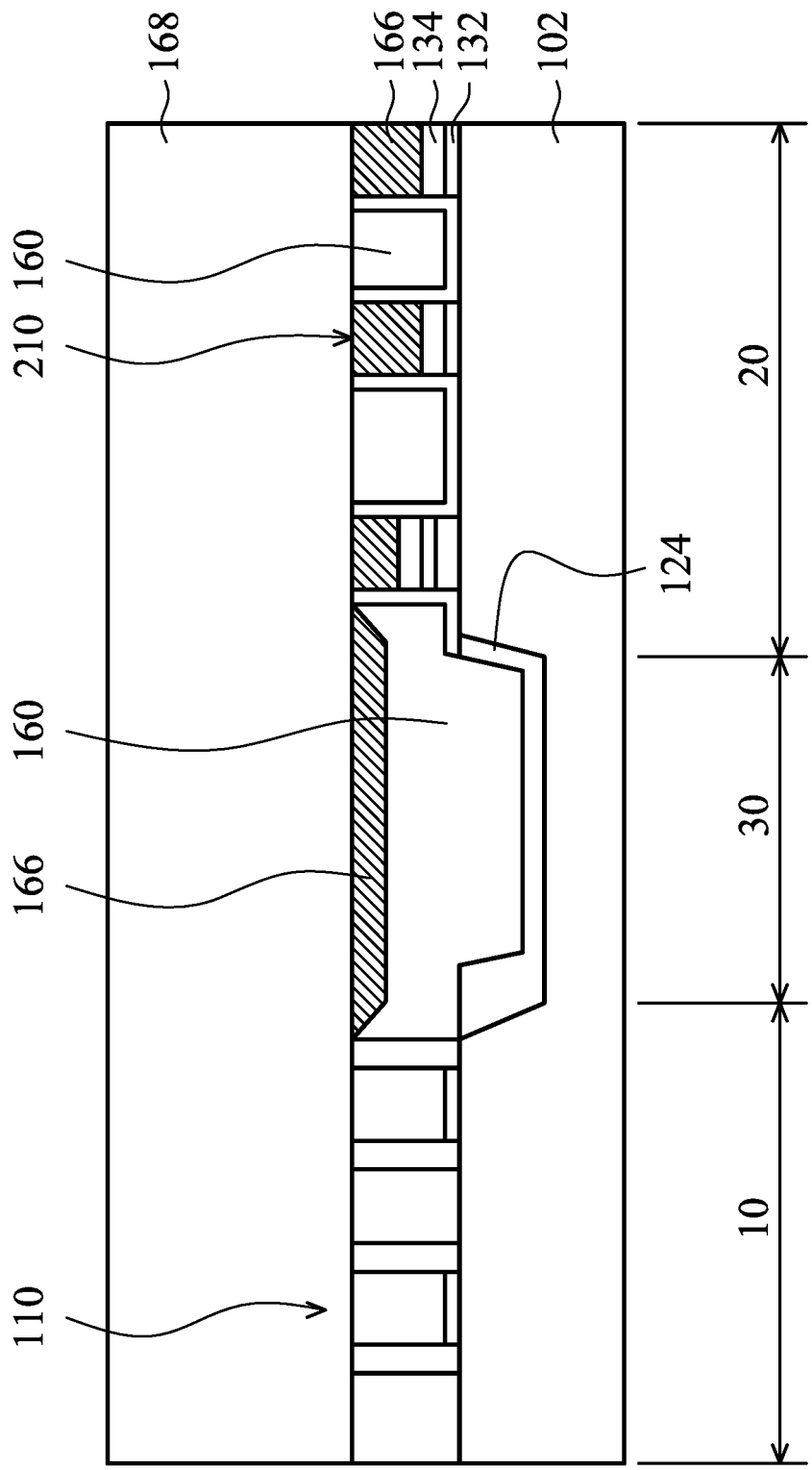

After the photoresist layer 162 is formed on the top surface of the ILD layer 160 in the pixel region 10, the polysilicon layer 136 is removed as shown in FIG. 1M, in accordance with some embodiments of the disclosure. Therefore, a plurality of trenches (not shown) is formed and a second metal layer 166 is filled in the trenches. In addition, the second metal layer 166 is also formed on the recessed surface of the ILD layer 160 in the boundary region 30. It should be noted that in the boundary region 30, the second metal layer 166 is embedded in the ILD layer 160.

The second metal layer 166 is made of conductive material. The conductive material may include metal (e.g., tantalum (Ta), titanium (Ti), molybdenum (Mo), tungsten (W), platinum (Pt), aluminum (Al), hafnium (Hf), ruthenium (Ru)), a metal silicide (e.g., titanium silicide, cobalt silicide, nickel silicide, tantalum silicide), or a metal nitride (e.g., titanium nitride, tantalum nitride). In some embodiments, the second metal layer 166 is formed by a chemical vapor deposition (CVD) process or a physical vapor deposition (PVD) process.

In some embodiments, the first metal layer 134 and the second metal layer 166 are made of the same material. In some other embodiments, the first metal layer 134 and the second metal layer 166 are made of different material. The thickness of the first metal layer 134 is smaller than that of the second metal layer 166.

It should be noted that after deposition of the second metal layer 166, a planarizing process is performed on the second metal material to remove the excess of the second metal material outside of the trenches. Therefore, a top surface of the second metal layer 166 in the peripheral region 20 is level with a top surface of the second metal layer 166 in the boundary region 30. In other words, the top surface of the second metal layer 166 in the boundary region 30 is higher than the top surface of the first metal layer 134 in the peripheral region 20.

After the planarizing process is performed on the second metal material, a second ILD layer 168 is formed on the second metal layer 166, the gate stack structure 110 and 210. Afterwards, the metallization structure (not shown) includes an interconnect structure, such as contact plugs and conductive features. Conductive features are embedded in the second ILD layer 168.

As shown in FIG. 1M, a gate stack structure 210 is constructed by the high-k dielectric layer 132, the first metal layer 132 and the second metal layer 134. The high-k dielectric layer 132 is used as a gate dielectric layer, and the first metal layer 132 and the second metal layer 134 are used as a gate electrode layer. In addition, sealing layers 150 are formed on the opposite sidewalls of the gate stack structure 210.

Although three gate stack structures 210 are formed in the peripheral region 20, the number of gate stack structures 210 are not limited to three and it may be adjusted according to actual application.

As shown in FIG. 1M, the high-k dielectric layer 132, the first metal layer 134 and the second metal layer 166 are formed in the peripheral region 20, but no remaining high-k dielectric layer 132 and the first metal layer 134 are formed in the boundary region 30. More importantly, no remaining high-k dielectric layer 132 and the first metal layer 134 are formed in the pixel region 10.

If the devices with the high-k dielectric layer and the metal layer (or called HK/MG) in the peripheral region are formed before the devices (such as photodiode (PD)) in the pixel region, the photodiode is sensitive to the metal ion and the performance of the photodiode may be degraded due to the contamination of the metal ion. In addition, formation of the photodiode in the pixel region is operated a high temperature, therefore the metal layer in the peripheral region may be deteriorated due to the high temperature.

It should be noted that in order to avoid the contamination and decline of the metal layer, the devices (such as the gate stack structure 110 and a photodiode) in the pixel region 10 are formed first, and the devices (such as gate stack structure 210) in the peripheral region 20 are formed afterwards, in accordance with some embodiments of the disclosure. Therefore, the metal layer (such as first metal layer 134 and/or the second metal layer 166) in the peripheral region 20 is not affected by the high temperature. Furthermore, the high-k dielectric layer and the metal layer (also called HK/MG) in the boundary region 30 are removed completely by an over-etching process, and therefore metal contamination is avoided. In addition, the performance of the devices (such as photodiode) in the pixel region 10 is improved.

Embodiments of an image sensor and a method for forming an image sensor are provided. The image sensor is a front-side illumination (FSI) image sensor or a back-side illumination (BSI) image sensor. The image sensor includes a substrate, and the substrate includes a pixel region, a peripheral region and a boundary region, and the boundary region is formed between the pixel region and the peripheral region. A high-k dielectric layer and a metal layer (also called HK/MG) are formed in the peripheral region. However, the high-k dielectric layer and the metal layer are not formed in the pixel region and the boundary region. Therefore, metal contamination problem is avoided. In addition, because the devices in the pixel region are formed before formation of the devices in the peripheral region, the high-k dielectric layer and the metal layer (also called HK/MG) is not affected by the high temperature caused by formation of the devices in the pixel region. Therefore, the illumination efficiency of the image sensor is improved.

In some embodiments, an image sensor is provided. The image sensor includes a substrate, and the substrate includes a pixel region, a peripheral region and a boundary region, and the boundary region is formed between the pixel region and the peripheral region. The image sensor also includes a first gate stack structure formed in the pixel region and a second gate stack structure formed in the peripheral region. The second gate stack structure includes a high-k dielectric layer and a first metal layer.

In some embodiments, an image sensor is provided. The image sensor includes a substrate, and the substrate includes a pixel region, a peripheral region and a boundary region, and the boundary region is formed between the pixel region and the peripheral region. The image sensor also includes a dielectric layer formed on and in the substrate in the boundary region. The image sensor further includes a metal layer formed in the boundary region, and the metal layer is embedded in the dielectric layer.

In some embodiments, a method for forming an image sensor is provided. The method includes providing a substrate, and the substrate includes a pixel region, a peripheral region and a boundary region, and the boundary region is formed between the pixel region and the peripheral region. The method also includes forming a first gate stack structure in the pixel region and forming a protection layer on the first gate stack structure. The method further includes forming an isolation structure in the substrate, and the isolation structure is formed in the boundary region. The method includes forming a high-k dielectric layer, a first metal layer and a polysilicon layer on the substrate. The method also includes forming and patterning a hard mask layer on the polysilicon layer to form a patterned hard mask layer. The method includes removing a portion of the high-k dielectric layer, the first metal layer and the polysilicon layer by using the patterned hard mask layer as a mask, and the high-k dielectric layer and the first metal layer are remained in the boundary region. The method further includes removing the high-k dielectric layer and the first metal layer in the boundary region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, comprising:
providing a substrate, wherein the substrate comprises a pixel region, a peripheral region and a boundary region, and the boundary region is formed between the pixel region and the peripheral region;
forming a first gate stack structure in the pixel region;
forming a protection layer on the first gate stack structure;
forming an isolation structure in the substrate, wherein the isolation structure is formed in the boundary region;
forming a plurality of layers over the substrate and over the protection layer;
patterning the plurality of layers to form a stack in the peripheral region of the substrate, wherein the plurality of layers remain in the boundary region when patterning the stack; and
subsequently, removing the plurality of layers in the boundary region.

2. The method for forming the image sensor as claimed in claim 1, wherein at least one of the plurality of layers is a high-k dielectric.

3. The method for forming the image sensor as claimed in claim 2, wherein at least one of the plurality of layers is a metal layer.

4. The method for forming the image sensor as claimed in claim 1, after removing the plurality of layers in the boundary region, further comprising:
removing a portion of the isolation structure to form a recess in the isolation structure.

5. The method for forming the image sensor as claimed in claim 4, further comprising:
forming a dielectric layer in the recess and in the peripheral region.

6. The method for forming an image sensor as claimed in claim 1, wherein the forming the protection layer on the first gate stack structure includes depositing amorphous silicon.

7. The method for forming an image sensor as claimed in claim 6, wherein the protection layer is formed having a sloped sidewall over the boundary region.

8. The method for forming the image sensor as claimed in claim 7, further comprising: forming the plurality of layers over the sloped sidewall.

9. A method for forming an image sensor, comprising:
providing a substrate, wherein the substrate comprises a pixel region, a peripheral region and a boundary region, and the boundary region is formed between the pixel region and the peripheral region;
providing at least one gate stack structure in the pixel region;
forming a protection layer on a first gate stack structure of the at least one gate stack structure;
forming an isolation structure in the substrate, wherein the isolation structure is formed in the boundary region;
after forming the protection layer and the isolation structure, depositing a plurality of layers on the substrate extending from over the protection layer in the boundary region to the peripheral region;
performing one or more etching processes on the plurality of layers to form a first stack and a second stack with a cavity interposing the first stack and the second stack in the peripheral region and remove the plurality of layers from the boundary region, wherein the isolation structure is recessed during the one or more etching processes.

10. The method of claim 9, wherein the depositing the plurality of layers includes:
depositing a high-k dielectric layer; and
depositing a conductive layer over the high-k dielectric layer.

11. The method of claim 10, wherein the depositing the plurality of layers further includes:
depositing a polysilicon layer over the conductive layer, wherein the conductive layer is a metal layer.

12. The method of claim 11, further comprising:
removing the polysilicon layer from at least one of the first stack or the second stack; and
forming another metal layer in a trench provided by the removing the polysilicon layer.

13. The method of claim 12, wherein the forming another metal layer also includes forming the another metal layer over the recessed isolation structure.

14. The method of claim 13, wherein the forming the another metal layer over the recessed isolation structure includes forming the another metal layer over an interlayer dielectric (ILD) layer disposed over the recessed isolation structure and in the cavity between the first stack and the second stack.

15. A method for forming an image sensor, comprising:
providing a substrate having a plurality of gate structures in a pixel region, a plurality of features interposed by cavities in a peripheral region and an isolation feature in a boundary region between the pixel region and the peripheral region;
depositing a dielectric material over the isolation feature and the plurality of features in the peripheral region, wherein the dielectric material has a concave top surface over the isolation feature; and
replacing a sacrificial layer of at least one of the plurality of features in the peripheral region with a conductive material, wherein during a deposition of the conductive material, a portion of the conductive material is formed over the dielectric material over the concave top surface in the boundary region.

16. The method of claim 15, further comprising:
etching back the dielectric material to expose a top surface of the sacrificial layer of each of the plurality of features.

17. The method of claim 15, wherein deposition of the conductive material includes depositing a metal of at least one of tantalum (Ta), titanium (Ti), molybdenum (Mo), tungsten (W), platinum (Pt), aluminum (Al), hafnium (Hf), or ruthenium (Ru).

18. The method of claim 15, wherein deposition of the conductive material includes forming a metal silicide.

19. The method of claim 15, further comprising: forming a recess in the isolation feature and depositing the dielectric material over the recess.

20. The method of claim 19, wherein after depositing the dielectric material, performing a chemical mechanical planarization process to form the concave top surface.

* * * * *